United States Patent [19]
Hosen

[11] Patent Number: 5,497,291
[45] Date of Patent: Mar. 5, 1996

[54] POWER SEMICONDUCTOR DEVICE INCLUDING TERMINAL PLATES LOCATED BETWEEN TWO SUBSTRATES THAT FUNCTIONS AS ELECTRICAL CONNECTORS AND MECHANICAL SUPPORTS

[75] Inventor: Toru Hosen, Kanagawa, Japan

[73] Assignee: Fuji Electric Co., Ltd., Kanagawa, Japan

[21] Appl. No.: 456,925

[22] Filed: Jun. 1, 1995

Related U.S. Application Data

[62] Division of Ser. No. 407,041, Mar. 17, 1995, which is a continuation of Ser. No. 995,378, Dec. 23, 1992, abandoned.

[30] Foreign Application Priority Data

Dec. 26, 1991 [JP] Japan .................................. 3-343755

[51] Int. Cl.⁶ .......................... H05K 1/11; H01L 23/12; H01R 23/68; H01R 23/72
[52] U.S. Cl. ................. 361/804; 174/138 G; 174/166 S; 257/678; 361/736; 361/742; 361/790; 361/796; 439/74; 439/507
[58] Field of Search ................. 174/52.1, 52.4, 174/138 C, 166 S; 257/678, 723, 724, 692, 691, 690, 796; 361/728, 735, 736, 784, 785, 786, 788, 787, 789, 790, 791, 803, 804, 807, 808, 809, 810, 758, 770, 742; 437/925; 439/43, 44, 45, 65, 68, 69, 74, 75, 76, 78, 493, 507

[56] References Cited

U.S. PATENT DOCUMENTS 5,382,830  1/1995  Akyürek et al. .................. 361/807

FOREIGN PATENT DOCUMENTS

| 0289439 | 11/1988 | European Pat. Off. | ............ 257/678 |
| 62-16554 | 1/1987 | Japan | ............ 257/792 |
| 62-16553 | 1/1987 | Japan | ............ 257/792 |
| 1-45073 | 2/1989 | Japan | ............ 439/74 |
| 5-299876 | 11/1993 | Japan | ............ 361/790 |

*Primary Examiner*—Donald A. Sparks
*Attorney, Agent, or Firm*—Finnegan, Henderson, Farabow, Garrett & Dunner

[57] ABSTRACT

A power semiconductor device having power chips mounted on a metal insulating substrate and terminal plates corresponding to inner connection wiring for a main circuit of the device. Electronic parts forming a control circuit are mounted on a second substrate disposed over the first substrate and supported by the terminal plates. Additionally, it is preferable to use a copper plate as wiring material for the main circuit.

5 Claims, 2 Drawing Sheets

POWER SEMICONDUCTOR DEVICE INCLUDING TERMINAL PLATES LOCATED BETWEEN TWO SUBSTRATES THAT FUNCTIONS AS ELECTRICAL CONNECTORS AND MECHANICAL SUPPORTS

This is a division of application Ser. No. 08/407,041, filed Mar. 17, 1995, which is a continuation of Ser. No. 07/995,378 filed Dec. 23, 1992 now abandoned.

BACKGROUND OF THE INVENTION

1. Field of the Invention

The present invention relates to a structure of a power semiconductor device used for a power transistor module which may be applied to an inverter device, for example.

2. Description of the Related Art

A conventional power semiconductor device is constructed in a manner to have the assembly of a circuit containing the power chip, the drive circuit of the power chip, and the protective circuit of the power chip, mounted on a planar surface of a substrate, and a package covering the circuit assembly and the planar surface of the substrate.

FIG. 3 shows a conventional assembly structure for a power transistor module. In FIG. 3, a metal insulating plate 1 is constructed by forming copper foil conductive patterns 1c having a thickness of about several tens of micrometers on a metal plate 1a of aluminum. The metal plate 1a serves as a heat sink base through an insulating layer 1b such as epoxy resin. A power transistor chip 2 is mounted on the metal insulating plate 1, and various electronic parts 3, such as diode chips, form a control circuit. Bonding wires 4 connect each of the power chips 2 and the electronic parts 3 to the conductive patterns 1c. A package 5 covers the device, and an outer lead terminal 6 extends outwardly, penetrating the package 5. The main circuit current, which flows to the power chip 2, is taken out through the conductive pattern 1c formed on the substrate and the outer lead terminal 6.

Since the conductive patterns 1c of the substrate 1 are used as a main circuit internal wiring connection as they stand in the above-mentioned structure, it is necessary that a path width of the copper foil conductive pattern 1c of the substrate 1 be enlarged so as to obtain a desired electrical capacitance. The path width must become larger as the electrical capacitance is increased. Consequently, the desired area of a metal insulating substrate is increased and the structure contained in the package 5 inevitably becomes larger, thereby leading to higher cost.

SUMMARY OF THE INVENTION

The present invention was made in consideration of the above-mentioned problems. The object of the present invention is to provide a power semiconductor device which has a small area substrate and can sufficiently apply a large electrical capacitance.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To solve the above-mentioned problems associated with the conventional structures, in the semiconductor device of the present invention, as a main circuit, terminal plates separate from the substrate are used as an internal wiring connection in which a large electric current flows, such as wiring connecting the power chips to the outer lead terminal and a wiring connecting the power chips to each other. These terminal plates are disposed above the substrate and have ends extending down to the substrate and connected thereto.

Further, to achieve the objects and in accordance with the purpose of the invention, as embodied and broadly described herein, the power semiconductor device of the present invention comprises power chips mounted on a metal insulating substrate. Terminal plates forming internal wiring connections for the main circuit are disposed above the substrate. The electronic parts forming the control circuit are mounted on a second substrate supported above the metal insulating substrate by the terminal plates. Additionally, it is preferable to use a copper plates as the terminal plates.

With the above-mentioned structure, the main circuit current which flows in the power chips flows in the internal wiring connection of the copper terminal plates constructed above a planar surface of the substrate with ends extending toward the substrate and soldered thereto. Further, the terminal plates are independent parts separate from the substrate, and the sectional area (thickness and width) and length etc. of the terminal plates can be freely selected in accordance with the electrical capacitance of the power chip. Therefore, the formation of conductive patterns on the copper foil of the substrate corresponding to the internal wiring connection of the main circuit is not needed. Merely the formation of the power chip, outer lead terminal, mounting portion for the electronic parts of the control circuit and the circuit pattern corresponding to the internal connection wiring of the control circuit are required. Thus, the desired area of the substrate is remarkably decreased in comparison with the structure in which a wide pattern of internal connection wiring for a main circuit is formed on the copper foil.

BRIEF DESCRIPTION OF THE DRAWINGS

The accompanying drawings, which are incorporated in and constitute a part of this specification illustrate embodiments of this invention and, together with the description, serve to explain the objects, advantages and principles of the invention. In the drawings.

DESCRIPTION OF THE PREFERRED EMBODIMENTS OF THE INVENTION

Figure 1:
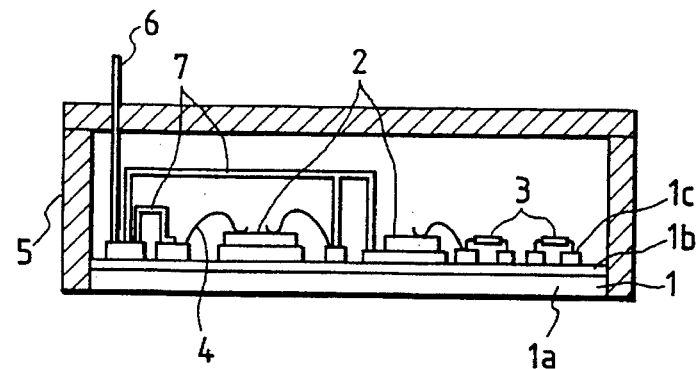
FIG. 1 shows a side view of an embodiment of the present invention.

The embodiments of the present invention will be described with reference to drawings below. Reference numerals designating corresponding elements in the different embodiments will be used throughout the Figures.

In a first embodiment of the invention, as shown in FIG. 1, power chips 2, electronic parts 3 forming the control circuits, and an outer lead terminal 6 are mounted on a conductive pattern 1c on a planar surface of a metal insulating substrate 1. Terminal plates 7, separate and spaced apart from the metal insulating substrate 1, are connected to the conductive patterns 1c of the metal insulating substrate 1 by soldering. The terminal plates 7 are bent so as to form an internal wiring path of the main circuit and are disposed above the planar surface of the metal insulating substrate 1 with ends extending down to the planar surface of the metal insulating substrate and connected thereto. The terminal plates may have branches extending above the substrate 1 which do not have an end extending down to the substrate 1. Further, the terminal plates 7 may be positioned at different heights above the substrate 1 in order to pass above or below one another without contacting each other. The cross-sectional areas of the terminal plates 7 is selected in accordance with the electrical capacitance of the power chips 2. The internal wiring connection of the control circuit for driving and protecting the power chips 2 is formed by the conductive patterns 1c of the metal insulating substrate 1. A package 5, formed from an epoxy resin such as polybutyleneterephthalate (PBT) or poly-phenylene-sulfide (PPS), covers the device, and an outer lead terminal 6 extends outwardly from the device and penetrates the package 5.

Figure 2:
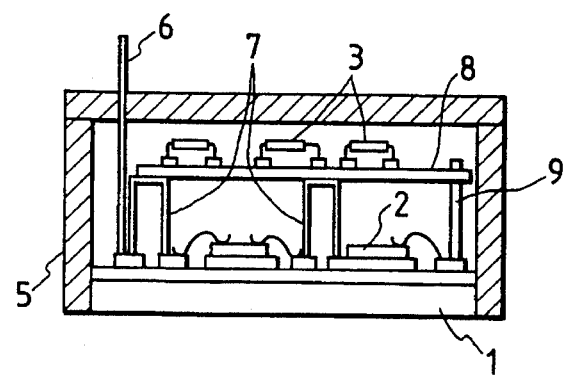
FIG. 2 shows a side view of second embodiment of the present invention.
Figure 3:
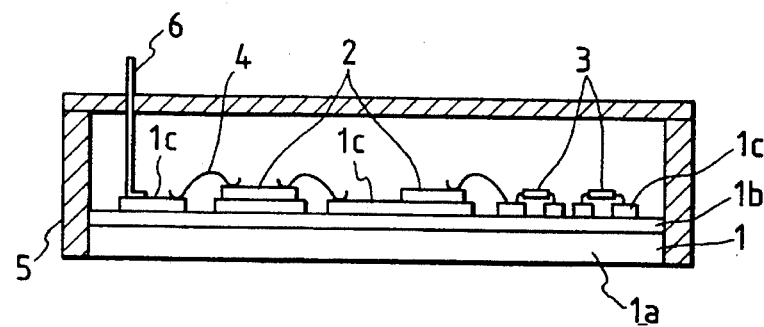
FIG. 3 shows a side view of 8 conventional power semiconductor device.
Figure 4:
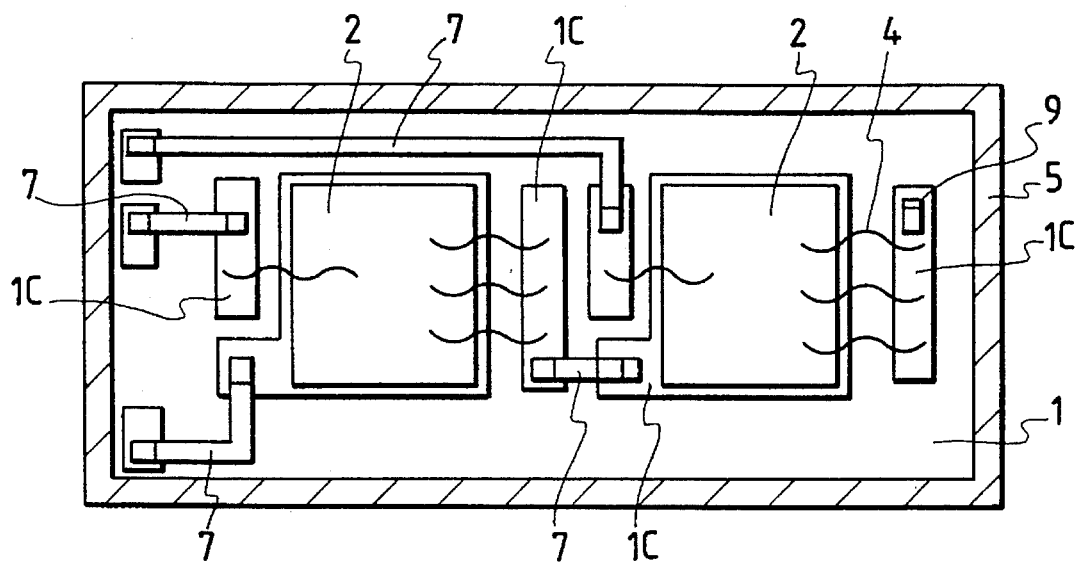
FIG. 4 is a top view of the substrate 1 and elements attached thereto shown in FIG. 2.
Figure 5:
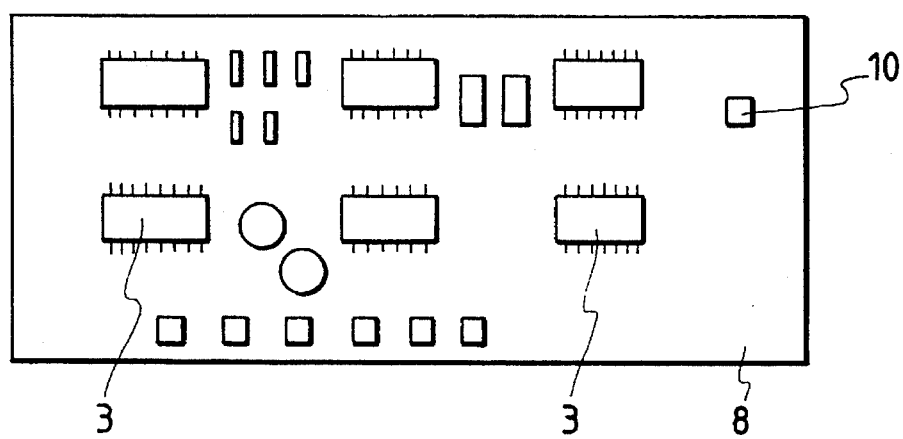
FIG. 5 is a top view of the substrate 8 and elements attached thereto shown in FIG. 2.

In a second embodiment of the invention, as shown in FIG. 2, power chips 2, outer lead terminal 6 and terminal plates 7 forming internal wiring connections of the main circuit as described with respect to the first embodiment are mounted on a planar surface of a metal insulating substrate 1 and arranged as shown in FIG. 4. Various electronic parts 3 forming a control circuit for the power chips 2 are mounted on a metal control circuit substrate 8 separate and distinct from the metal insulating substrate i and are arranged as shown in FIG. 5. The control circuit substrate 8 is formed in the same manner as the substrate 1 and is supported above the planar surface of the metal insulating substrate 1 in a two stage stacking type arrangement using the terminal plates 7 as supports. A connection terminal 9 is connected between the metal insulating substrate 1 and the control circuit substrate 8 by being inserted into hole 10 in the substrate 8 and soldered to the substrate 8. A package 5, formed from an epoxy resin such as polybutylene-terephthalate (PBT) or polyphenylene-sulfide (PPS), covers the device, and an outer lead terminal 6 extends outwardly from the device and penetrates the package 5.

By such a two-stage stacking structure, the entire electronic device can be constructed in a small and compact size while having high heat radiation for the power chips 2. Further, since the electronic parts 3 of control circuit have a calorific value extremely smaller than the power chips 2, even if a substrate 8 is disposed on a middle stage in a package as shown in FIG. 2, no problems occur in the operation of the device.

As explained above, according to the structure of the present invention, by using a terminal plate other than the substrate as inner connection wiring of a main circuit in which a large current flows, and constructing the terminal plate to be connected to the metal insulating substrate so as to be disposed above the metal insulating substrate, the formation of a wide internal wiring pattern on a copper foil of the substrate is not needed, and the cross-sectional area of the terminal plate can be freely selected in accordance with the electrical capacitance of power chips. Therefore, a power semiconductor device having a large electrical capacitance can be constructed on a metal insulating substrate having a small area.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles if the invention and its practical application to enable one skilled in the art to utilize the invention in various embodiments and with various modifications as are suited to the particular use contemplated. It is intended that the scope of the invention be defined by the claims appended thereto, and their equivalents.

What is claimed is:

1. A power semiconductor device comprising:

a first substrate having a planar surface;

a plurality of power chips mounted on said planar surface of first substrate;

an output terminal mounted on said first substrate;

a plurality of terminal plates, separate from said first substrate, for connecting said power chips to said output terminal and to each other, each of said plurality of terminal plates being spaced apart from said first substrate and having at least two ends extending toward and connected to said planar surface of said first substrate;

a second substrate supported apart from said first substrate by said plurality of terminal plates;

a control circuit formed on said second substrate;

a terminal connecting said second substrate to said first substrate;

wiring connecting said control circuit to said power chips through said connecting terminal.

2. A power semiconductor device according to claim 1 wherein said first substrate comprises:

a metal plate having a planar surface;

an insulating layer formed on said planar surface of said metal plate; and a conductive pattern of copper foil formed on said insulating surface.

3. A power semiconductor device according to claim 1, further comprising:

a package covering said plurality of power chips, said control circuit, said second substrate, said connecting terminal, said wiring, and said plurality of terminal plates and said planar surface of said first substrate; said output terminal being connected to said first substrate extending outward from said planar surface of said first substrate and through said package.

4. A power semiconductor device according to claim 1 wherein at least one of said plurality of terminal plates includes a portion disposed above said first substrate at a height different than a height at which at least one other of said plurality of terminal plates in disposed.

5. A power semiconductor device according to claim 1, wherein at least one of said plurality of terminal plates includes a branch disposed above said substrate, said branch having an end extending parallel to said planar surface of said substrate.

* * * * *

UNITED STATES PATENT AND TRADEMARK OFFICE
CERTIFICATE OF CORRECTION

PATENT NO. : 5,497,291
DATED : March 05, 1996
INVENTOR(S) : Toru HOSEN

It is certified that error appears in the above-indentified patent and that said Letters Patent is hereby corrected as shown below:

On the Title page, and in col. 1, line 4, "FUNCTIONS" should read --FUNCTION--.

Claim 4, column 4, line 59, "in" should read --is--.

Signed and Sealed this

Twenty-ninth Day of October 1996

Attest:

BRUCE LEHMAN

*Attesting Officer*    *Commissioner of Patents and Trademarks*